US012539530B2

(12) United States Patent
Paul et al.

(10) Patent No.: US 12,539,530 B2
(45) Date of Patent: Feb. 3, 2026

(54) THROTTLE VALVE AND FORELINE CLEANING USING A MICROWAVE SOURCE

(71) Applicant: Applied Materials, Inc., Santa Clara, CA (US)

(72) Inventors: Khokan Chandra Paul, Cupertino, CA (US); Truong Van Nguyen, Milpitas, CA (US); Kelvin Chan, San Ramon, CA (US); Diwakar Kedlaya, San Jose, CA (US); Anantha K. Subramani, San Jose, CA (US); Abdul Aziz Khaja, San Jose, CA (US); Vijet Patil, Bangalore (IN); Yusheng Fang, Santa Cruz, CA (US); Liangfa Hu, Newark, CA (US); Prashant Kumar Kulshreshtha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/833,408

(22) Filed: Jun. 6, 2022

(65) Prior Publication Data

US 2023/0390811 A1 Dec. 7, 2023

(51) Int. Cl.
*B08B 7/00* (2006.01)
*B08B 5/00* (2006.01)
(Continued)

(52) U.S. Cl.
CPC .............. *B08B 7/0035* (2013.01); *B08B 5/00* (2013.01); *B08B 9/0328* (2013.01);
(Continued)

(58) Field of Classification Search
CPC ....... B08B 5/00; B08B 7/0035; B08B 9/0328; B08B 2209/032; C23C 16/4405;
(Continued)

(56) References Cited

U.S. PATENT DOCUMENTS 5,453,125 A * 9/1995 Krogh ............... H01J 37/32678 118/724
6,366,346 B1 * 4/2002 Nowak ............ H01J 37/32834 216/60
(Continued)

FOREIGN PATENT DOCUMENTS

JP 2005347426 A 12/2005
JP 2020191444 A 11/2020
(Continued)

OTHER PUBLICATIONS

Application No. PCT/US2023/024310 , International Search Report and Written Opinion, Mailed on Sep. 22, 2023, 9 pages.
(Continued)

*Primary Examiner* — Benjamin Kendall
(74) *Attorney, Agent, or Firm* — Kilpatrick Townsend & Stockton LLP

(57) ABSTRACT

Exemplary semiconductor processing systems may include a processing chamber defining a processing region. The systems may include a foreline coupled with the processing chamber, the foreline defining a fluid conduit. The systems may include a radical generator having an inlet and an outlet. The outlet may be fluidly coupled with the foreline. The systems may include a gas source fluidly coupled with the inlet of the radical generator. The systems may include a throttle valve coupled with the foreline downstream of the radical generator.

20 Claims, 5 Drawing Sheets

(51) Int. Cl.
*B08B 9/032* (2006.01)
*H01J 37/32* (2006.01)

(52) U.S. Cl.
CPC .. *H01J 37/32357* (2013.01); *H01J 37/32449* (2013.01); *H01J 37/32862* (2013.01); *B08B 2209/032* (2013.01); *H01J 2237/332* (2013.01); *H01J 2237/334* (2013.01)

(58) Field of Classification Search
CPC ............ C23C 16/4412; H01J 37/32357; H01J 37/32449; H01J 37/32834; H01J 37/32871; H01J 37/32862; H01J 2237/332; H01J 2237/334
See application file for complete search history.

(56) References Cited

U.S. PATENT DOCUMENTS

| | | | | |
|---|---|---|---|---|
| 10,889,891 | B2 | 1/2021 | L'heureux | |
| 2002/0066535 | A1* | 6/2002 | Brown | H01L 21/67017 118/712 |
| 2003/0036272 | A1 | 2/2003 | Shamouilian et al. | |
| 2005/0011445 | A1* | 1/2005 | Upham | C23C 16/4405 118/715 |
| 2007/0095282 | A1* | 5/2007 | Moon | B08B 7/0035 118/715 |
| 2007/0128876 | A1 | 6/2007 | Fukiage | |
| 2011/0203610 | A1* | 8/2011 | Leu | H01J 37/32357 134/1.1 |
| 2014/0374024 | A1* | 12/2014 | Nguyen | H01J 37/32357 156/345.31 |
| 2020/0032392 | A1* | 1/2020 | L'Heureux | C23C 16/54 |
| 2020/0083029 | A1* | 3/2020 | Nozawa | H01J 37/32862 |
| 2021/0257194 | A1* | 8/2021 | Birru | H01L 21/67028 |
| 2021/0391156 | A1 | 12/2021 | Chan et al. | |
| 2022/0170151 | A1 | 6/2022 | Fu et al. | |

FOREIGN PATENT DOCUMENTS

| | | | |
|---|---|---|---|
| JP | 2021524162 | A | 9/2021 |
| KR | 20150052383 | A | 5/2015 |
| KR | 20190080505 | A | 7/2019 |
| KR | 20210105489 | A | 8/2021 |

OTHER PUBLICATIONS

Korean Application No. 10-2025-7000194, Office Action mailed on Oct. 29, 2025, 8 pages.

Application No. JP2024-571338 , Office Action, Mailed On Dec. 9, 2025, 19 pages.

* cited by examiner

THROTTLE VALVE AND FORELINE CLEANING USING A MICROWAVE SOURCE

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary semiconductor processing systems may include a processing chamber defining a processing region. The systems may include a foreline coupled with the processing chamber, the foreline defining a fluid conduit. The systems may include a radical generator having an inlet and an outlet. The outlet may be fluidly coupled with the foreline. The systems may include a gas source fluidly coupled with the inlet of the radical generator. The systems may include a throttle valve coupled with the foreline downstream of the radical generator.

In some embodiments, the radical generator may include a microwave radical generator. The radical generator may be positioned proximate the throttle valve. The gas source may include a gas panel. The gas source may include a remote plasma source. The systems may include a cooling line coupled with the radical generator. During operation of the radical generator, a pressure in the processing chamber may be greater than a pressure in the foreline. The foreline may include a J-pipe defining a first inlet, an outlet, and a second inlet disposed at a bend of the J-pipe. The radical generator may be coupled with the second inlet.

Some embodiments of the present technology may encompass semiconductor processing systems. The systems may include a processing chamber defining a processing region. The systems may include a foreline coupled with the processing chamber. The foreline may define a fluid conduit. The systems may include a radical generator that is fluidly coupled with the foreline. The systems may include a throttle valve coupled with the foreline downstream of the radical generator.

In some embodiments, the systems may include a gas source coupled with an inlet of the radical generator. The gas source may include a gas panel. During operation of the radical generator, a pressure in the processing chamber may be greater than a pressure in the foreline. The systems may include at least cooling line coupled with a cooling fluid source. The radical generator may include a fluid inlet and a fluid outlet. The at least one cooling line may be fluidly coupled with the fluid inlet and the fluid outlet. The radical generator may include an RF radical generator or a microwave radical generator. The foreline may include a J-pipe defining a first inlet, an outlet, and a second inlet disposed at a bend of the J-pipe. The radical generator may be coupled with the second inlet.

Some embodiments of the present technology may encompass methods of cleaning a throttle valve. The methods may include flowing a first gas into a processing chamber. The methods may include venting the first gas from the processing chamber and into a foreline. The methods may include flowing a second gas to a radical generator coupled with the foreline. The methods may include generating a plasma of the second gas within the radical generator. The methods may include flowing a third gas through the radical generator to force radicals of the plasma into the foreline. The methods may include flowing the first gas, the second gas, and third gas through a throttle valve coupled with the foreline downstream of the radical generator.

In some embodiments, the first gas may include a plasma-generating precursor. The first gas may include an inert gas or a cleaning gas. A flow of the first gas may be greater than a flow of the third gas and a flow of the second gas. The plasma may include a capacitively coupled microwave plasma.

Such technology may provide numerous benefits over conventional systems and techniques. For example, embodiments of the present technology may utilize locally-generated plasma radicals to actively clean residue that has deposited within the foreline and/or throttle valve. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
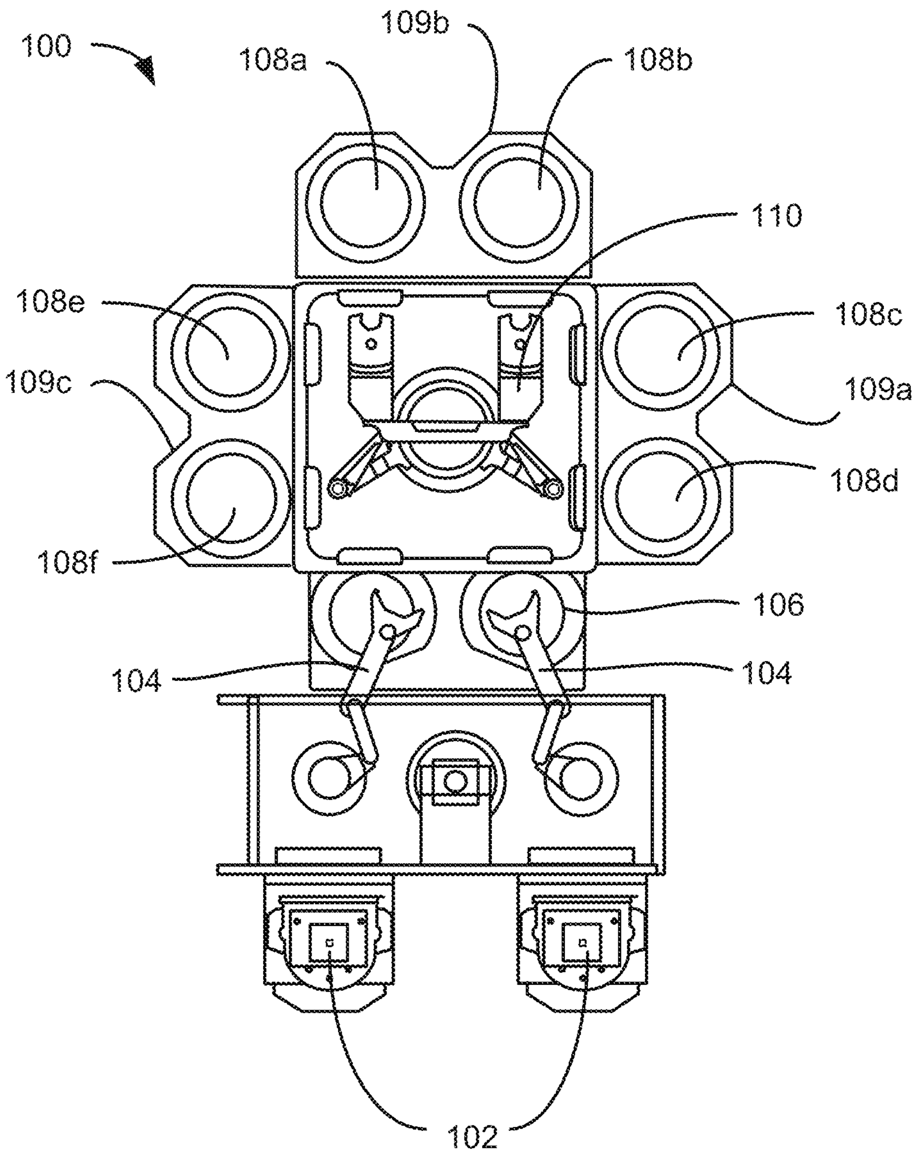
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

Precursors and/or other process gases are often vented from the chamber through a number of forelines. The pressure and fluid conductance of the vented gas may be controlled by one or more throttle valves that are coupled with the forelines. As the precursor passes through the forelines and throttle valve, radicals from the precursor strike the interior of the forelines and throttle valve, causing residue to be deposited on the forelines and throttle valve. This may be especially problematic for temperature sensitive deposition processes, as large temperature differences between the processing region and the foreline/throttle valve may lead to significantly higher deposition rates within the foreline and/or throttle valve than in the processing region. As these residues accumulate within the throttle valve, the residue reduces the cross-sectional area of the flow path of the throttle valve, which effectively changes the flow conductance through the throttle valve and causes throttle valve drift. For example, over time the accumulation of residue requires the throttle valve to open to a greater degree (drift) to maintain a desired conductance due to the reduction in cross-sectional area of the flow path. This throttle valve drift changes the cross-sectional area of the flow path associated with each angle of the throttle valve and, over time, requires the throttle valve to be opened to greater angles to account for the decrease in conductance and change in pressure of gases flowing through the throttle valve. At larger angles, the throttle valve becomes more difficult to control to deliver precise conductance and fluid pressures.

Conventionally, to combat the effects of throttle valve drift, it has been necessary to flush the forelines and throttle valve with high temperature purge gases, such as NF3, that remove the residue and clean the surfaces of the throttle valve. However, these high temperature purge gases may be harmful to chamber components. Therefore, conventional systems must carefully balance the desire to reverse and/or reduce throttle valve drift with the need to minimize the exposure of chamber components to such high temperature purge gases.

The present technology overcomes these challenges by coupling a radical generator with the foreline, oftentimes at a location that is proximate the throttle valve. The radical generator may generate plasma radicals that may clean residue that has deposited within the foreline and/or throttle valve. The cleaning radicals may be generated during deposition operations, during chamber cleaning operations, and/or during idle chamber times. This may help clean the throttle valve while having a neutral impact on throughput of the processing chamber. Accordingly, the present technology may reduce the occurrence of throttle valve drift and reduce (or eliminate) the need for high temperature throttle valve purges.

Although the remaining disclosure will routinely identify specific cleaning processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific cleaning processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
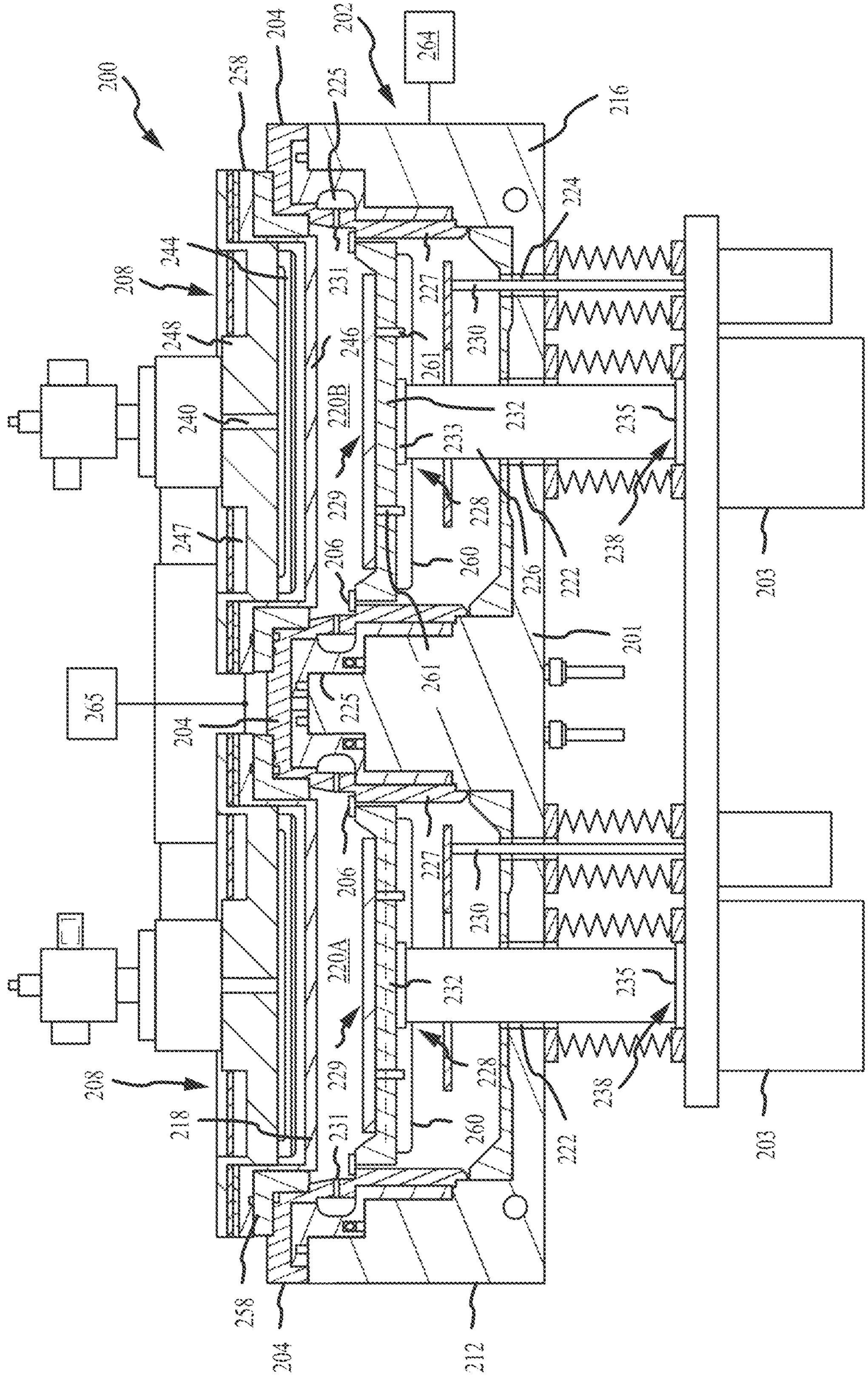
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
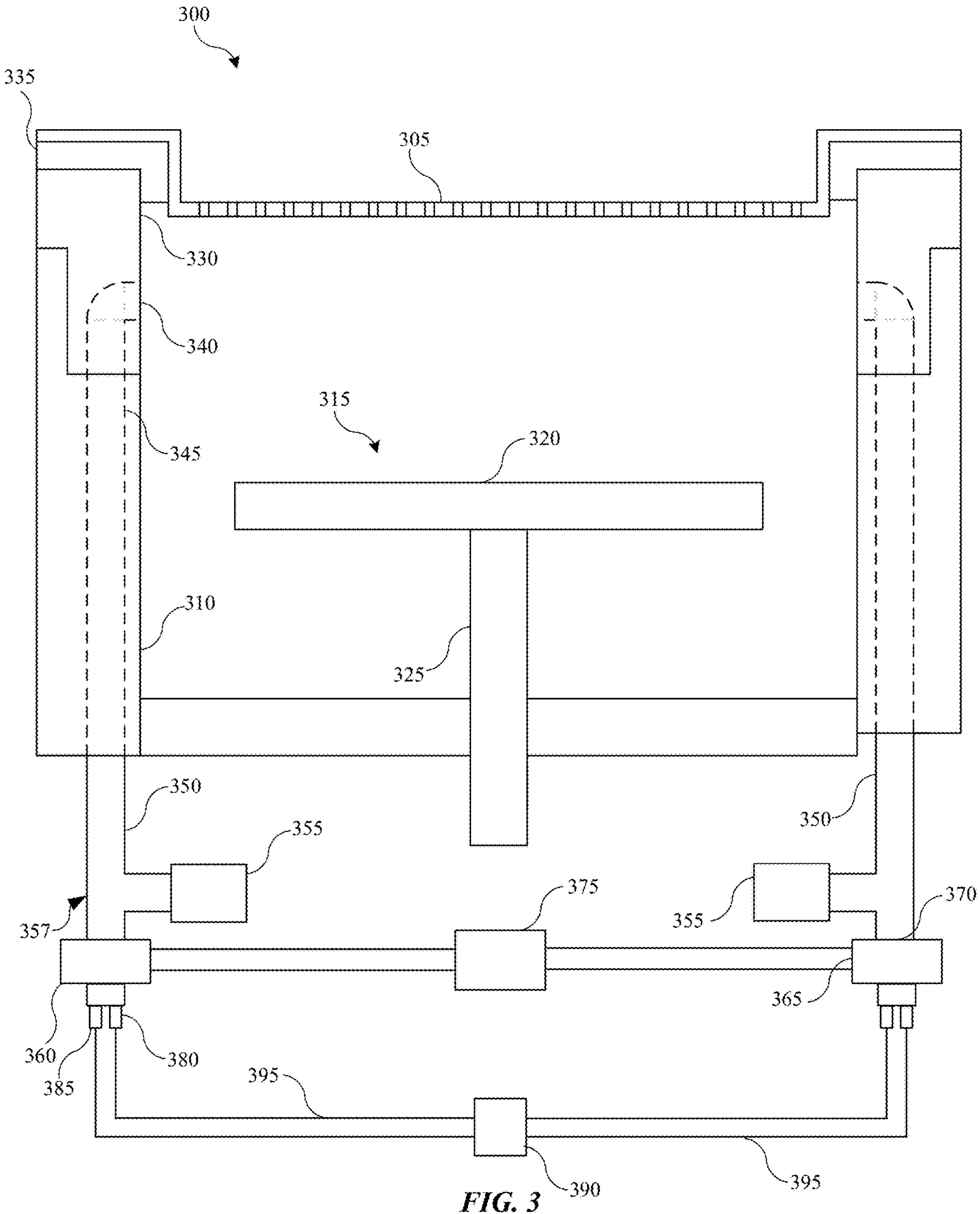
FIG. 3 shows a schematic cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200. System 300 is understood to include any feature or aspect of system 200 discussed previously in some embodiments. The system 300 may be used to perform semiconductor processing operations including deposition of hardmask materials as previously described, as well as other deposition, removal, and cleaning operations. System 300 may show a partial view of the chamber components being discussed and that may be incorporated in a semiconductor processing system, and may illustrate a view across a center of the faceplate, which may otherwise be of any size, and include any number of apertures. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The chamber may also include a chamber body 310, which as illustrated may include sidewalls and a base. A pedestal or substrate support 315 may extend through the base of the chamber as previously discussed. The substrate support 315 may include a support plate 320, which may support semiconductor substrate. The support plate 320 may be coupled with a shaft 325, which may extend through the base of the chamber.

The faceplate 305 may be supported, either directly or indirectly, by the chamber body 310. As just one example, the faceplate 305 may be supported atop a pumping liner 330 and/or a isolator or other liner 335. For example, the pumping liner 330 may be seated on a shelf formed by a top of the chamber body 310, with the additional liner 335 and/or faceplate 305 seated atop the pumping liner 330. Pumping liner 330 may define one or more exhaust ports 340 that enable the flow of gases from the processing region to one or more forelines 350 that are coupled with the processing chamber. For example, each exhaust port 340 may be fluidly coupled with a top end of one or more exhaust lumens 345 that are formed within the sidewalls and/or base of the chamber body 310. While shown with the exhaust lumen 345 extending through the sidewalls, it will be appreciated that other arrangements are possible in various embodiments. A bottom end of exhaust lumen 345 may be coupled with a respective one of the forelines 350. Each foreline 350 may define a fluid conduit for flowing process gases out of the processing chamber and directing the process gases through a throttle valve 355, which may control the fluid conductance through the forelines 350.

The forelines 350 may be coupled with a radical generator 360, which may be disposed proximate an inlet of the throttle valve 355. The radical generator 360 may include at least one inlet 365 that is coupled with a gas source 375, which may supply one or more gases to the radical generator 360. In some embodiments, the gas source 375 may be a remote plasma unit that delivers gas to the processing chamber. For example, a divert line may be included that enables a portion of gas from the remote plasma unit to bypass the chamber and enter the radical generator 360. In other embodiments, the radical generator 360 may include a dedicated gas source 375. For example, the gas source 375 may include one or more gas sticks from a gas panel, with one or more fluid delivery lines that introduce gases from the gas source 375 to the inlet 365 of the radical generator 360. An outlet 370 of the radical generator 360 may be fluidly coupled with the foreline 350 upstream of the throttle valve 355 such that any gases and/or plasmas that exit the outlet 370 pass through the throttle valve 355.

In a particular embodiment, each foreline 350 may be and/or include a J-pipe 357 that includes a first inlet, and outlet, and a second inlet disposed at a bend and/or other intermediate position of the J-pipe 357 that is disposed between the first inlet and outlet. The first inlet may be coupled to an inlet portion of the foreline 350 and/or to one of the exhaust lumens 345, while the outlet may be coupled with an outlet portion of the foreline 350 and/or with the throttle valve 355. The second inlet may be coupled with the outlet 370 of the radical generator 360 such that the throttle valve 355 is disposed downstream of the radical generator 360. While shown with J-pipe 357, it will be appreciated that other embodiments may utilize other foreline configurations to fluidly couple the radical generator 360 proximate to and upstream of the throttle valve 355.

The radical generator 360 may take various forms. For example, the radical generator 360 may be a microwave radical generator, an RF radical generator, or other radical generator. In a particular embodiment, the radical generator 360 may be a microwave radical generator that uses a magnetron to produce microwave energy, which may be then brought to a hollow coaxial electrode via coaxial waveguides. The microwave power may be capacitively coupled into the plasma gas via the electrode. The use of a microwave radical generator, rather than an RF radical generator, may enable smaller radical generators to be utilized. Additionally, microwave radical generators may produce higher numbers of radicals per unit of power, which may enable lower power levels to be used to produce sufficient radicals to effectively clean the foreline 350 and/or throttle valve 355.

In some embodiments, the radical generator 360 may include a fluid inlet 380 and a fluid outlet 385 that may be fluidly coupled with a cooling fluid source 390 via one or more cooling lines 395. The cooling fluid source 390, such as a process chilled water source, may supply a circulating fluid to fluid inlet 380 of the radical generator 360 via the fluid lines 395. In this manner, a heat transfer path may be established that may lower the temperature of at least a portion of the radical generator 360. For example, the radical generator 360 may include circuitry that controls operation of the radical generator 360. This circuitry, which is often near the fluid inlet 380 and/or fluid outlet 385, may need to be maintained at or below a predetermined temperature to ensure that the circuitry continues to operate as designed. The predetermined temperature may vary based on the radical generator 360, but may oftentimes be less than or about 100° C., less than or about 90° C., less than or about 80° C., less than or about 75° C., less than or about 70° C., or less. To maintain the temperature of the circuitry at such levels, the cooling fluid, which may be water, ethylene glycol, and/or other coolant, may be provided at temperatures of less than or about 100° C., less than or about 90° C., less than or about 80° C., less than or about 75° C., less than or about 70° C., less than or about 65° C., less than or about 60° C., less than or about 55° C. less than or about 50° C., or lower.

While discussed primarily in the context of placing a radical generator proximate the throttle valve, it will be appreciated that the present invention is not so limited. Embodiments of the present invention may implement radical generators anywhere within the processing system where localized cleaning is desired. For example, a particular chamber/system component may be identified as being able to benefit from cleaning using locally generated radicals, and a radical generator may be interfaced proximate the component at a location that is upstream of the component such that any plasma radicals generated may reach the desired component before the lifetime of the radicals has elapsed.

Figure 4:
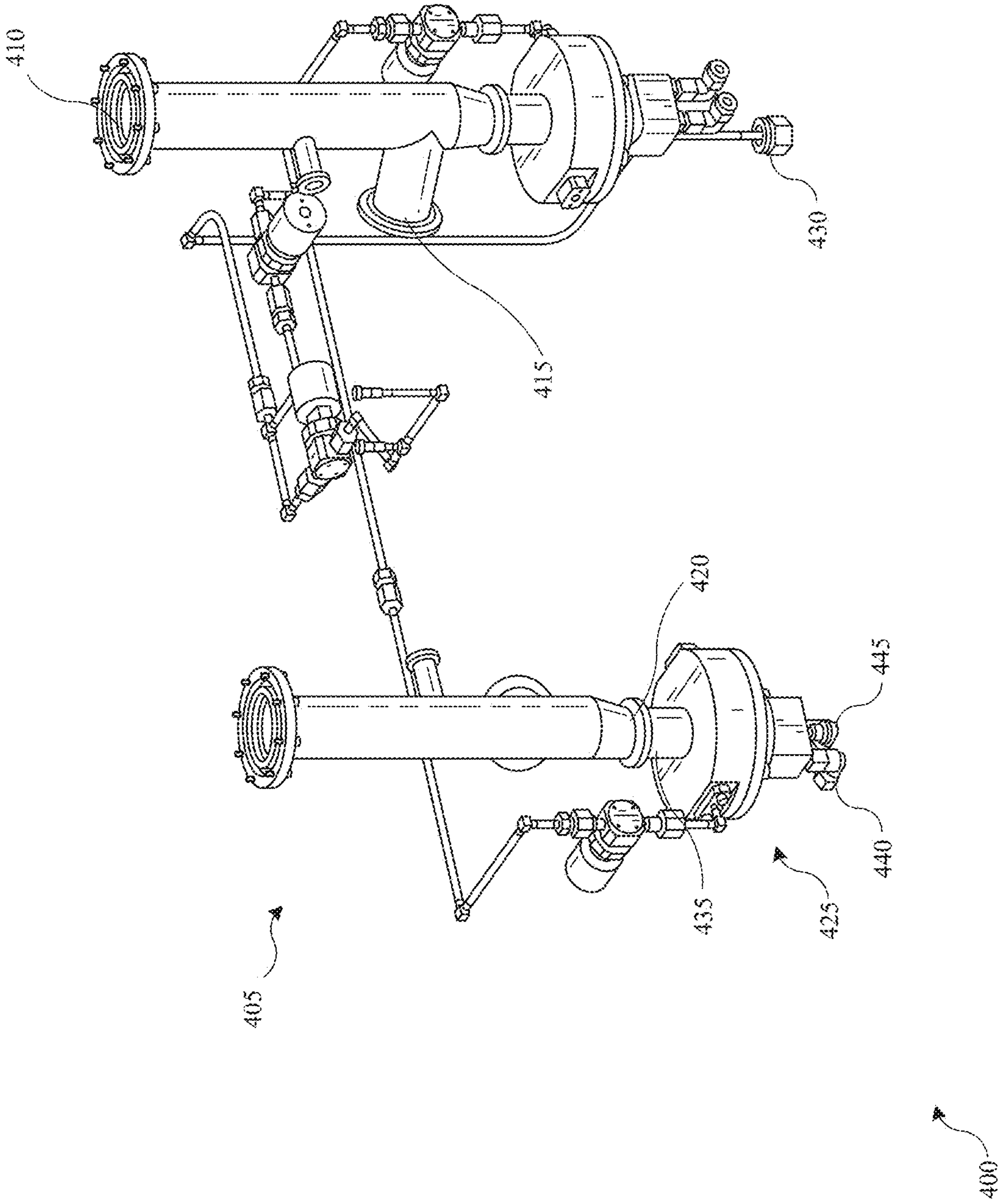
FIG. 4 shows a schematic isometric view of an exemplary foreline assembly according to some embodiments of the present technology.

FIG. 4 shows a schematic isometric view of an exemplary foreline assembly 400 according to some embodiments of the present technology. The foreline assembly 400 may be included in any chamber or system previously described, as well as any other chamber or system that may benefit from the insert. For example, the foreline assembly 400 may include components similar to foreline 350 and radical generator 360 and may include any of the features described in relation to such features of FIG. 3. For example, the foreline assembly 400 may include at least a portion of one or more forelines 405. Each foreline 405 may include an inlet 410 that may be directly or indirectly coupled with an exhaust lumen (such as exhaust lumen 345) of a processing chamber and an outlet 415 that may be directly or indirectly coupled with a throttle valve (such as throttle valve 355). In some embodiments, each foreline 405 may be in the form of a J-pipe that includes an additional inlet 420 disposed at a bend or other intermediate location of the J-pipe. The additional inlet 420, which may be downstream of the inlet 410 and upstream of outlet 415, may be coupled with a radical generator 425.

Radical generator 425 may be similar to radical generator 360 and may include any features described in relation to radical generator 360. For example, the radical generator 425 may include at least one inlet 430 that is coupleable with a gas source (such as gas source 375). For example, the inlet 430 may include a gas weldment that is coupleable with a gas panel to transport gas from the gas panel to the radical generator 425. An outlet 435 of the radical generator 425 may be fluidly coupled with the foreline 405 upstream of the outlet 415 such that any gases and/or plasmas generated by and/or passing through the radical generator 425 exit the outlet 415. In some embodiments, the radical generator 425 may include a fluid inlet 440 and a fluid outlet 445 that may be fluidly coupled with a cooling fluid source (such as cooling fluid source 390), which may be used to circulate a cooling fluid to the radical generator 425 to cool circuitry and/or other electrical components of the radical generator 425.

Figure 5:
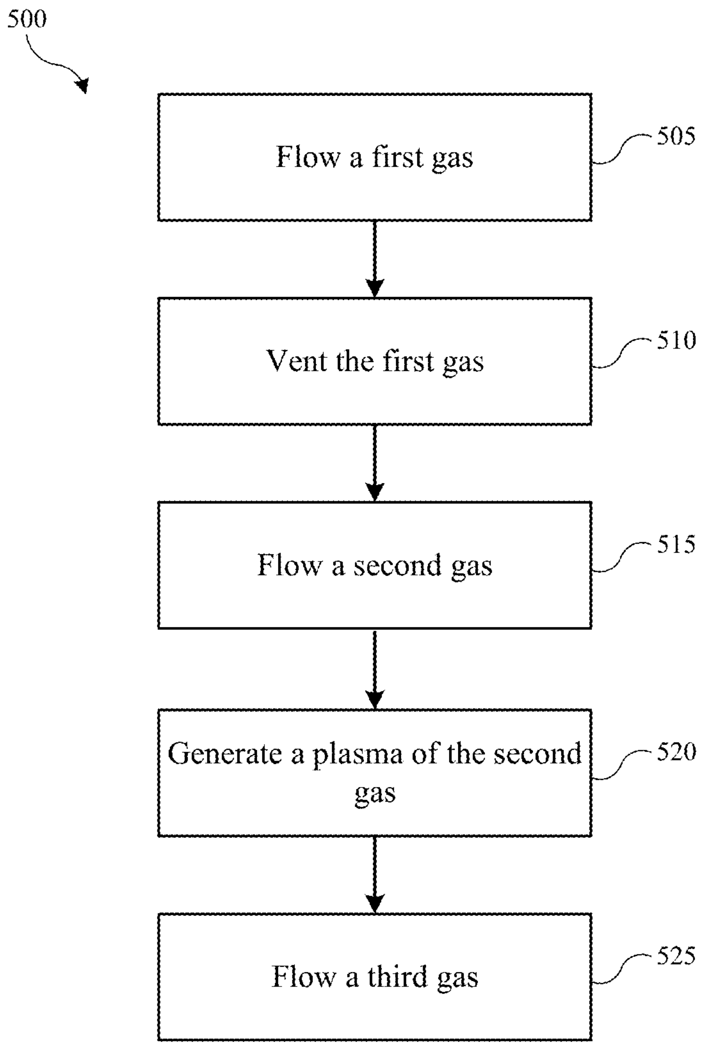
FIG. 5 shows operations of an exemplary method of cleaning a throttle valve according to some embodiments of the present technology.

FIG. 5 illustrates operations of an exemplary method 500 of cleaning a throttle valve according to some embodiments of the present technology. The method may be performed in a variety of processing chambers, including processing system 200 and/or 300 described above, which may include forelines and/or radical generators according to embodiments of the present technology, such as forelines 350, 405 and/or radical generators 360 and/or 425. Method 500 may include a number of optional operations, which may or may not be specifically associated with some embodiments of methods according to the present technology.

The method may include optional operations prior to initiation of method 500, or the method may include additional operations. For example, method 500 may include operations performed in different orders than illustrated. Method 500 may include flowing a first gas into a processing chamber at operation 505. The first gas may generate a positive flow through the processing chamber and, when vented, through the foreline. The first gas may be a plasma-generating precursor, an inert gas, a cleaning gas, and/or other gas. For example, if the throttle valve is cleaned during deposition operations, the first gas may be a process gas, such as, but not limited to, a plasma-generating precursor. If the throttle valve is cleaned during a chamber cleaning process, the first gas may be a cleaning gas and/or a plasma-generating gas that generates plasma radicals that are used to clean residue from the chamber components. If the throttle valve is cleaned during an idle period of the chamber (i.e., not during processing operations or cleaning operations), the first gas may be an inert gas that is flowed merely to generate positive flow and pressure within the forelines.

At operation 510, the method may include venting the first gas from the processing chamber and into a foreline. While the first gas is flowing through the foreline, the method 500 may include flowing a second gas to a radical generator coupled with the foreline at operation 515. A plasma of the second gas may be generated within the radical generator at operation 520. The flow of the second gas and the generation of plasma radicals may be tuned based on a desired throttle valve angle (and current throttle valve angle). In other words, the radical generation may be based on the amount of residue needed to be cleaned to achieve a desired throttle valve angle. In some embodiments, the second gas may include a plasma-generating gas that is used for cleaning operations, such as argon. Upon striking the plasma, a third gas may be flowed through the radical generator to force radicals of the plasma into the foreline at operation 525. In a particular embodiment, the third gas may include a mixture of argon, NF3, and O2, however numerous other gases may be utilized as the third gas. The flow of the first gas may be greater than the flow of the second gas (and radicals) and the third gas such that the first gas, the second gas (and radical), and third gas flow downstream of the radical generator and pass through a throttle valve coupled with the foreline. The flowing radicals may then react with residue deposited on the foreline and/or throttle valve to help clean the residue from the surfaces of the components. To ensure the flow of the first gas is greater than the flow of the second gas and the third gas, the volume and/or rate of the first gas may be greater than the combined rates and/or volumes of the second gas and the third gas, which may maintain a positive pressure flow through the foreline in a direction of the throttle valve, and may help prevent backstreaming of the second gas and third gas. By preventing backstreaming, embodiments may help deliver the plasma radicals to the throttle valve prior to the lifetime of the radicals elapsing, which may help increase the cleaning effectiveness of the radicals.

As noted above, in some embodiments, the cleaning methods may be performed during processing operations of the processing chamber. In such instances, the flow of the first gas may include flowing one or more precursors or other process gases into the processing chamber, such as through one or more of a gasbox, a blocker plate, or a faceplate, prior to delivering the precursor into a processing region of the chamber. A plasma may be generated of the precursors within the processing region, such as by providing RF power to the faceplate to generate a plasma and/or a plasma generated by a remote plasma unit may be delivered to the processing region. Material formed in the plasma may be deposited on a substrate. The precursor (i.e., first gas) may be vented from the processing chamber via the forelines, where the flow of the first gas mixes with the flow of the second and third gas prior to passing through the throttle valves.

In some embodiments, the method 500 may be performed to clean components other than the throttle valve. For example, one or more components may be identified as benefiting from targeted cleaning operations. One or more radical generators may be interfaced with a gas flow path upstream and proximate the one or more components. A positive flow of gas may be introduced to the flow path upstream of the radical generators, and then a plasma may be generated within the radical generator. A third gas may be flowed through the radical generator to push plasma radicals into the flow path and downstream to the one or more components.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “an aperture” includes a plurality of such apertures, and reference to “the plate” includes reference to one or more plates and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:

a processing region;

a first foreline and a second foreline coupled with the processing system, each foreline defining a fluid conduit;

a first radical generator and a second radical generator, each having an inlet and an outlet, the outlet of each radical generator being fluidly coupled with a respective one of the first foreline and second foreline downstream of the processing region, wherein:

each radical generator is fluidly coupled with a first gas source comprising a cleaning gas and a second gas source comprising a carrier gas;

each radical generator is configured to generate a plasma of the cleaning gas and to subsequently flow the carrier gas to the foreline; and the carrier gas forces radicals of the plasma into a respective foreline; and a first throttle valve and a second throttle valve, an inlet of each throttle valve coupled with an outlet of the respective one of the first foreline and second foreline downstream of the respective one of the first radical generator and the second radical generator and the processing region.

2. The semiconductor processing system of claim 1, wherein:

at least one of the first radical generator and the second radical generator comprises a microwave radical generator.

3. The semiconductor processing system of claim 1, wherein:

at least one of the first radical generator and the second radical generator is positioned proximate the throttle valve.

4. The semiconductor processing system of claim 1, wherein:

during operation of at least one of the first radical generator and the second radical generator, a pressure in the processing region is greater than a pressure in at least one of the first foreline and the second foreline.

5. The semiconductor processing system of claim 1, wherein:

at least one of the first foreline and the second foreline comprises a J-pipe defining a first inlet, an outlet, and a second inlet disposed at a bend of the J-pipe; and a respective one of the first radical generator and the second radical generator is coupled with the second inlet.

6. The semiconductor processing system of claim 1, wherein:

the carrier gas comprises at least one of argon, NF3, or O2.

7. The semiconductor processing system of claim 1, wherein:

the cleaning gas comprises argon.

8. The semiconductor processing system of claim 1, further comprising:

a gas panel comprising the first gas source and the second gas source.

9. The semiconductor processing system of claim 8, wherein:

the gas panel comprises a remote plasma source.

10. The semiconductor processing system of claim 1, further comprising:

a cooling line coupled with at least one of the first radical generator and the second radical generator.

11. The semiconductor processing system of claim 10, wherein:

the cooling line is fluidly coupled with a source comprising a cooling fluid.

12. The semiconductor processing system of claim 11, wherein:

the cooling fluid comprises one or both of water and ethylene glycol.

13. A semiconductor processing system, comprising:

a processing region;

a first foreline and a second foreline coupled with the processing system, each foreline defining a fluid conduit;

a first radical generator and a second radical generator that is fluidly coupled with a respective one of the first foreline and second foreline downstream of the processing region, wherein:

each radical generator is fluidly coupled with a first gas source comprising a cleaning gas and a second gas source comprising a carrier gas;

each radical generator is configured to generate a plasma of the cleaning gas and to subsequently flow the carrier gas to the foreline; and the carrier gas forces radicals of the plasma into a respective foreline; and a first throttle valve and a second throttle valve, an inlet of each throttle valve coupled with an outlet of the respective one of the first foreline and second foreline downstream of the respective one of the first radical generator and the second radical generator and the processing region.

14. The semiconductor processing system of claim 13, wherein:

during operation of at least one of the first radical generator and the second radical generator, a pressure in the processing region is greater than a pressure in at least one of the first foreline and the second foreline.

15. The semiconductor processing system of claim 9, wherein:

at least one of the first radical generator and the second radical generator comprises an RF radical generator or a microwave radical generator.

16. The semiconductor processing system of claim 13, wherein:

at least one of the first foreline and the second foreline comprises a J-pipe defining a first inlet, an outlet, and a second inlet disposed at a bend of the J-pipe; and respective one of the first radical generator and the second radical generator is coupled with the second inlet.

17. The semiconductor processing system of claim 13, further comprising:

the first gas source and the second gas source are coupled with an inlet of a respective one of the first radical generator and the second radical generator.

18. The semiconductor processing system of claim 17 further comprising:

a gas panel comprising the first gas source and the second gas source.

19. The semiconductor processing system of claim 13, further comprising:

at least one cooling line coupled with a cooling fluid source, wherein:

at least one of the first radical generator and the second radical generator comprises a fluid inlet and a fluid outlet; and the at least one cooling line is fluidly coupled with the fluid inlet and the fluid outlet.

20. The semiconductor processing system of claim 19, wherein:

the fluid inlet is proximate control circuitry of the radical generator.

* * * * *